Feb. 27, 1962 R. D. CONE 3,023,326

OVERLOAD PROTECTION CIRCUIT

Filed Jan. 6, 1958 4 Sheets-Sheet 1

INVENTOR.
RONALD D. CONE

BY Louis J. Knobbe

AGENT

Feb. 27, 1962

R. D. CONE 3,023,326

OVERLOAD PROTECTION CIRCUIT

Filed Jan. 6, 1958

4 Sheets-Sheet 2

INVENTOR.
RONALD D. CONE
BY Louis J. Knobbe
AGENT

INVENTOR.
RONALD D. CONE
BY Louis J. Knobbe
AGENT

Feb. 27, 1962 R. D. CONE 3,023,326

OVERLOAD PROTECTION CIRCUIT

Filed Jan. 6, 1958 4 Sheets-Sheet 4

INVENTOR.
RONALD D. CONE

BY Louis J. Knobbe
AGENT

United States Patent Office 3,023,326

Patented Feb. 27, 1962

3,023,326

OVERLOAD PROTECTION CIRCUIT

Ronald D. Cone, Bellflower, Calif., assignor to North American Aviation, Inc.

Filed Jan. 6, 1958, Ser. No. 707,156
3 Claims. (Cl. 307—88.5)

This invention relates to overload protecting circuit arrangements and particularly to those employing transistors.

Previous methods of protecting against the harmful effects of overloads and short circuits have been found to have several defects when applied to transistor circuits and measuring instruments of high sensitivity. In particular, the prior art devices, e.g., fuses and magnetically operating circuit breakers, have had a longer operating period than the thermal time constant of the transistors used. In effect, this usually meant that the transistors or instruments would be damaged before the fuses or circuit breakers operated to disconnect the short circuit.

The present invention employs a transistor in combination with a potential source and the load to be protected. For loads of a predetermined impedance and load currents below a critical value, the transistor is operated in a saturated region. A decrease in the value of impedance of the load caused by overloading or short-circuiting changes the operating condition from a saturated region to an active region wherein the load circuit is independent of the load impedance and is dependent solely on the characteristics of the protection circuit. These two operating regions of the transistor, namely the saturation and active regions, are characterized by low and high resistances respectively. During normal operating conditions, therefore, the transistor has little effect on the load circuit, while during an overload condition the load current is effectively limited by the change of operating regions.

It is accordingly an object of this invention to provide an improved overload protection circuit.

It is another object of this invention to provide an overload protection circuit in which only a small portion of the supply voltage is dropped across the circuit in a non-overload condition.

It is still another object of this invention to provide an overload protection circuit which dissipates only a small amount of power.

A further object of this invention is to provide an overload protection circuit in which the load current is independent of the load resistance during an overload condition.

Another object of this invention is to provide an overload protection circuit which inherently limits the overload current to a predetermined value.

It is another object of this invention to provide an overload protection circuit having a very fast time response, i.e., a time response effective for protecting transistor circuitry.

It is still another object of this invention to provide an overload protection circuit which inherently resets immediately upon the removal of an overload condition.

Briefly, in accordance with a preferred form of the present invention, an overload protection circuit includes a transistor connected in series with a potential source and the load to be protected. The transistor is biased so as to operate in the saturated region for load currents below a predetermined value and in the active or gain region for other load conditions. Since the saturation region is characterized by a low impedance, the protection circuit adds a very small resistance between the source and load for currents below a critical value. Currents above this predetermined value cause the change to the active region whereby a substantial resistance appears between the source and load. Furthermore, the maximum current which may flow through the load is fixed by the transistor biasing means.

A more thorough understanding of the invention may be obtained by a study of the following detailed description taken in connection with the accompanying draw-drawings in which—

Figure 1:
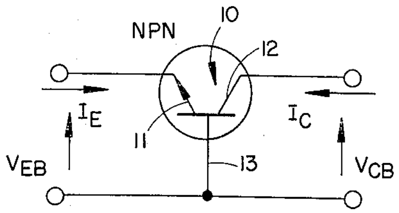
FIG. 1 illustrates the polarity definitions for an n-p-n transistor.
Figure 2:
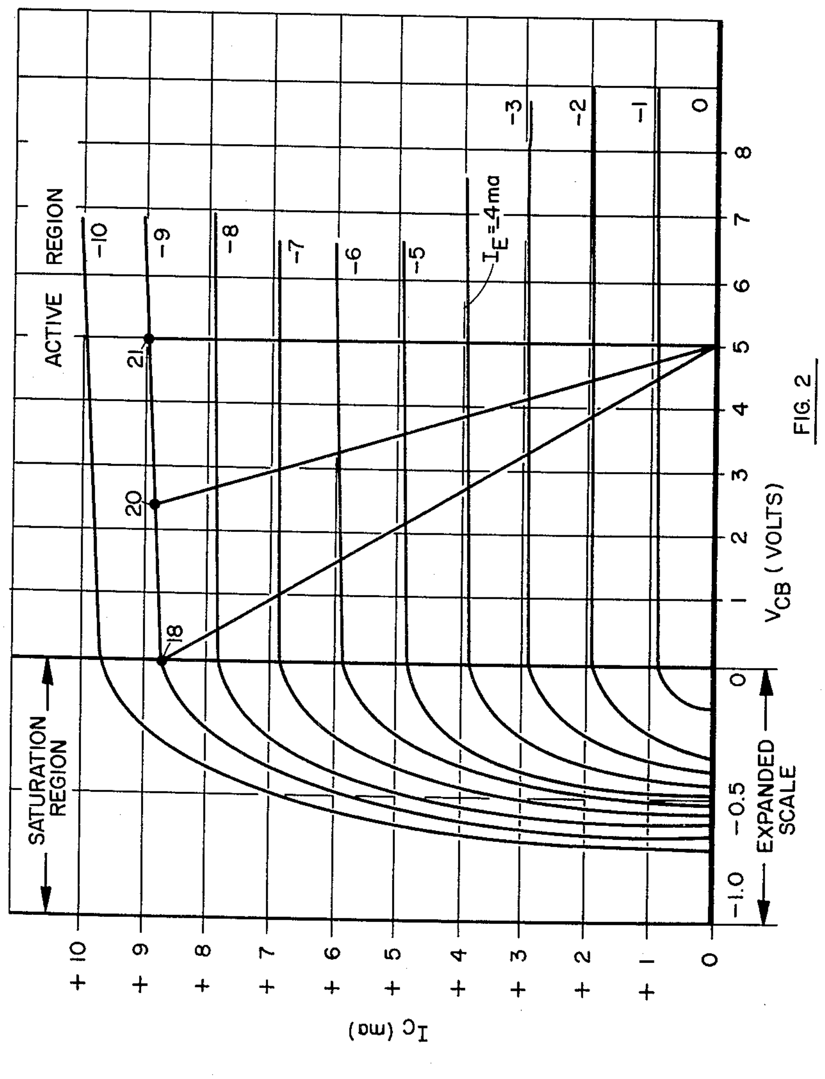
FIG. 2 illustrates the output characteristics of an n-p-n transistor connected in a common-base circuit.

Referring now to FIG. 1, an n-p-n transistor 10 is illustrated having an emitter electrode 11, collector electrode 12, and a base electrode 13. The polarity of the voltage between the emitter and base electrode is defined as $V_{EB}$. The polarity of the voltage between the collector and base electrodes is defined as $V_{CB}$. The emitter and collector currents are defined as $I_E$ and $I_C$ in the direction of current flow as shown. In FIG. 2 is illustrated the output characteristics of an n-p-n transistor connected in a common-base circuit. The region of positive $V_{CB}$ is known as the active operating region. This is the region in which the collector is reverse biased, i.e., the region in which the transistor is normally utilized. The region in which $V_{CB}$ is negative is known as the saturation region. As may be observed in FIG. 2, in this region the collector is forwardly biased. In this latter region, substantial current changes are caused by minute voltage changes. The saturation region is thus characterized by a very small dynamic resistance. Contrarywise, the active region is characterized by minute current changes in relation to substantial voltage changes. This later region, therefore, has a high dynamic resistance. This invention incorporates transistor circuitry employing these two pronounced operating regions.

Figure 3:
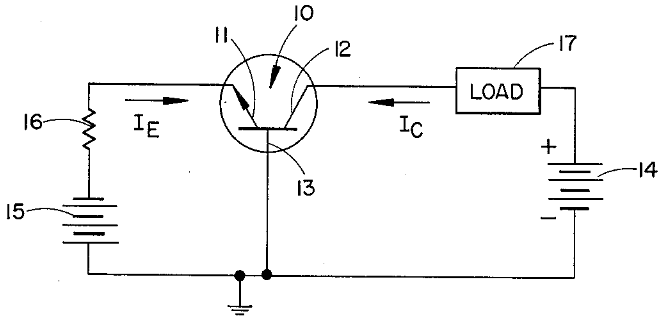
FIG. 3 illustrates schematically one embodiment of this invention.

FIG. 3 illustrates one embodiment of this invention. Transistor 10 has a load 17 and direct-current voltage supply 14 connected between its collector electrode 12 and base electrode 13. A biasing direct-current supply 15 and bias resistor 16 are connected in series and between the emitter electrode 11 and base electrode 13. Biasing source 15 is poled so as to forwardly bias the emitter electrode. Although an n-p-n transistor is illustrated, the present circuit is not limited to this particular type of transistor. For transistors such as junction transistors of the p-n-p type, which have forward emitter and reverse collector current flow in the opposite direction, the circuitry is the same except that the polarities of the direct-current supply sources are reversed.

In operation, the voltage source 14 and emitter biasing means are selected so that the load line preferably crosses the collector voltage axis at the zero voltage point. For example, in FIG. 2, for a load resistance of 575 ohms, an emitter current of —9 ma. and a collector voltage supply of 5 volts are selected. So long as the impedance of the load is equal to the predetermined value (575 ohms), the load line crosses the operating curve at point 18 and the transistor 10 operates in the saturation region. As hereinbefore noted, the resistance between the collector and base electrodes of the transistor is very low in the saturation region. This means that a very low resistance is connected in series with the load and potential source 14. The protection circuitry, therefore, has very little effect on the load circuitry.

As shown in FIG. 2, if the circuit is overloaded or short-circuited, i.e., if the resistance of the load is decreased partially or to substantially zero ohms, the load line will cross the transistor operating curve at points 20 or 21 instead of 18. The transistor is then in its active region which means that the collector current remains substantially constant regardless of the value of the load impedance or the supply voltage 14. The maximum flow of collector current is independent of the load impedance or supply voltage and is fixed by the amount of emitter current. In effect, the resistance between the collector and base of the transistor suddenly changes from a very low resistance to a quite substantial resistance. Transistor 10, however, cannot be damaged by an overload since its collector current is almost entirely dependent upon the value of the emitter current, the latter being unaffected by a change in load resistance.

The aforementioned operation may be more fully described by considering the equations applicable to the transistor operation. For example, assuming the following values for components 14, 15 and 16

$$E14=+15 \text{ volts} \quad (1)$$

$$E15=+18 \text{ volts} \quad (2)$$

$$R16=2\text{K ohms} \quad (3)$$

then $$I_E=-\frac{E15}{R16}=-9 \text{ ma.} \quad (4)$$

In the saturation region, the load circuit voltage equation is $$E14-I_C R_{Load}-V_{CB}=0 \quad (5)$$

Rewriting $$I_C=\frac{E14-V_{CB}}{R_{Load}} \quad (6)$$

Since $V_{CB}$ is very small in the saturation region, Equation 6 may be rewritten as $$I_C=I_{Load}\cong\frac{E14}{R_{Load}} \quad (7)$$

If $R_{Load}$ is 575 ohms, $I_C$ equals 8.7 ma. In the active region, the collector current is independent, to a good approximation, of the impedance of the load and associated voltage source and is determined by emitter biasing voltage 15 and resistor 16. The load current during a period of overload may therefore be rewritten as $$I_{Load}=-\alpha I_E=-\frac{\alpha E15}{R16} \quad (8)$$

The current gain $\alpha$ is defined as $$-\frac{I_C}{I_E}$$

at constant collector voltage $V_C$.

An important advantage of the protection circuit just described is that it responds to an overload condition in a few microseconds. It has been found that the transition time from the low series resistance (saturation) to the current limiting (active) region is sufficiently fast for protecting other transistors connected in the load circuit.

Another advantage of this protection circuit is that it inherently operates to reset to the operating mode immediately after the overload or short-circuit condition is removed. Of course, if this feature is undesirable, the emitter circuitry can be controlled by the load voltage so that, after a short-circuit condition has existed, the series transistor will be cut off and the load voltage reduced.

Techniques for accomplishing this are well-known in the prior art and circuitry for accomplishing same has not been included.

Figure 5:
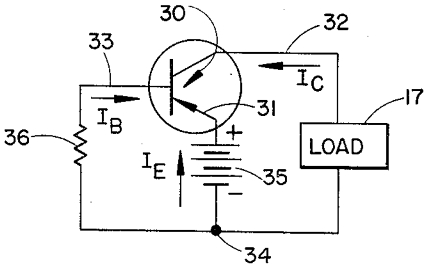
FIG. 5 illustrates schematically another embodiment of this invention.

Although the common-base connection has been illustrated thus far, the common-emitter connection can also be used. It will be noted in FIG. 4 that the output characteristics of a common-emitter stage are quite similar to the common-base connection, i.e., a transistor may operate in both a saturation and active region. A circuit utilizing a common-emitter connection is illustrated in FIG. 5. P-n-p transistor 30, having an emitter electrode 31, collector electrode 32, and a base electrode 33, is connected so as to drive load 17. As shown, the load is connected between the collector electrode 32 and junction point 34. Voltage source 35 is connected between the emitter electrode 31 and junction point 34. Connected between base 33 and junction point 34 is a biasing resistance 36. By suitably selecting the value of the voltage source 35 and the biasing resistance 36, a constant flow of base current $I_B$ may be selected since the base current is very nearly $$I_B=\frac{E35}{R36} \quad (9)$$

In the saturation region, the collector current is $$-I_C=\frac{E35-V_{EC}}{R_{Load}}=I_{Load} \quad (10)$$

Figure 4:
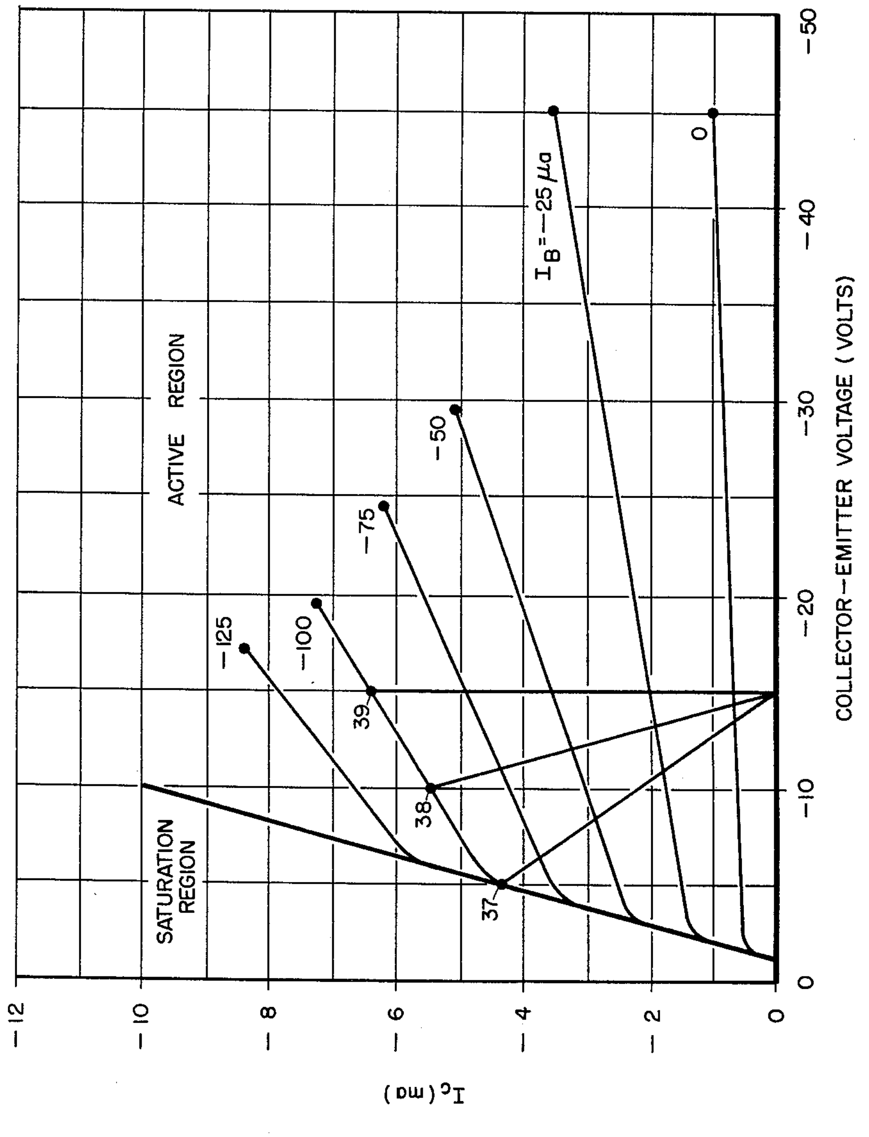
FIG. 4 illustrates the output characteristics of a p-n-p transistor connected in a common-emitter circuit.

From FIG. 4 it may be noted that $V_{EC}$ is small, therefore $$I_{Load}\cong\frac{E35}{R_{Load}} \quad (11)$$

In the active region $$I_{Load}=-I_C=I_B\beta \quad (12)$$

where $\beta$ is the base-current amplification factor.

Typical load lines are illustrated in FIG. 4 as crossing an operating curve at 37 for normal operation, and 38 and 39 for an overload and short-circuit condition.

As shown by the slope of the curves in the active region, $\beta$ is not a constant and increases slightly with voltage. Thus, the short-circuit current is somewhat higher than the current selected for the predetermined load impedance. Further, the transition from the saturation to the active region is not as abrupt as in the common-base circuit. Other differences are that the change in $V_{EC}$ in the saturation region is greater and the load current is more dependent on load resistance in the active region. Furthermore, the transistor parameter $\beta$ is widely variant between individual transistors as compared to $\alpha$ or A (where A equals the direct-current gain for the common-base circuit). For these reasons, the grounded-emitter circuit is somewhat less desirable than the grounded-base circuit.

Figure 6:
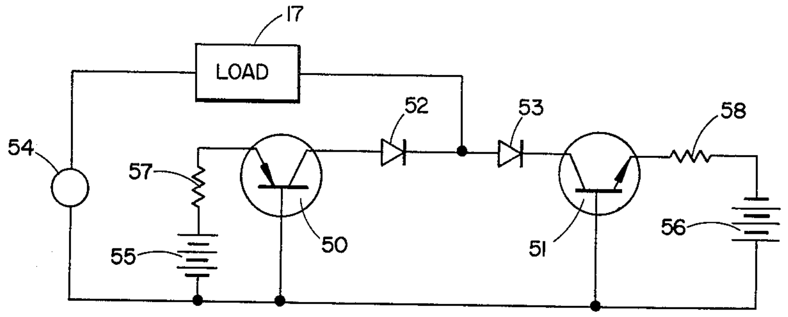
FIG. 6 illustrates schematically a further embodiment of this invention applicable to protecting against excessive alternating currents.

In FIG. 6 is illustrated a circuit for protecting against excessive alternating currents. A pair of transistors 50 and 51 of opposite conductivity type have their collector electrodes connected in series with diodes 52 and 53 poled in the direction of collector current flow. Connected between the common terminal of each diode and the base electrode of the associated transistor is an alternating-current source 54 and the load 17. Diodes 52 and 53 operate in a conventional manner to couple the positive and negative half cycles of alternating current to transistors 51 (for positive half cycles) and 50 (for negative half cycles). Connected to the emitter electrodes of each of the transistors are biasing sources 55, 56, and biasing resistors 57 and 58 poled so as to forwardly bias the respective emitter electrodes. It will be noted that the circuitry just described is, in effect, a pair of circuits similar to those illustrated in FIG. 3 wherein an n-p-n transistor is utilized in one and a p-n-p transistor in the other. Each transistor circuit handles alternate half cycles of the alternating current. This circuitry limits the maximum peak current, not the average current, except in an absolute short-circuit condition where the total applied potential appears across the transistor protective circuit.

Under certain operating conditions of the circuit of FIG. 6, it may be desirable to limit the maximum load current to different values for alternate half cycles. This may be done by applying different bias levels to the emitter electrodes of transistors 50 and 51. Thus, if biasing source 56 and resistor 58 are selected so as to permit a larger emitter current than do biasing source 55 and resistor 57, a larger maximum collector current will flow in transistor 51 than in transistor 50. The maximum currents permitted through load 17 are therefore at different levels for alternate half cycles.

Figure 7:
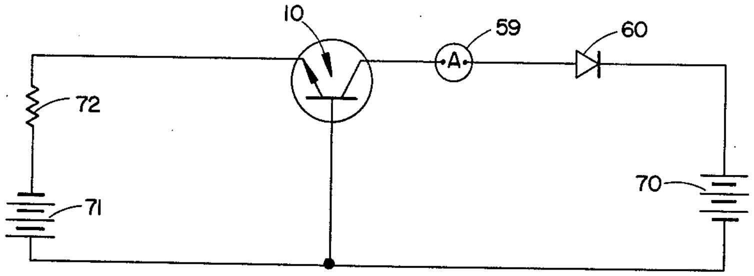
FIG. 7 illustrates the overload protection circuit as applied for protecting an electrical measuring instrument.

By way of illustration only, the following specific example is given as a typical application for which the overload protective circuitry may be utilized. Illustrated in FIG. 7 is a circuit wherein transistor 10 is connected in series with microammeter 59, a germanium diode 60 and a direct-current voltage source 70. Biasing direct-current source 71 and biasing resistor 72 are connected so as to forwardly bias the emitter electrode. It will be noted that the circuitry of FIG. 7 is substantially that of FIG. 3 with the addition of a microammeter 59 and diode 60 substituted for the load 17. The circuitry of FIG. 7 is used in measuring the leakage currents of germanium diodes such as diode 60 illustrated. A very sensitive ammeter is necessary since the normal leakage currents are less than 10 microamperes. However, an occasional diode has leakage currents of several milliamperes or higher which may result in substantial damage to the meter. In the circuit shown, the following component values are utilized:

| | |
|---|---|
| Transistor **10** | 2N167. |
| Direct-current source **70** | 20 volts. |
| Direct-current source **71** | 10 volts. |
| Resistance **72** | 200K ohms. |
| Microammeter **59** | Scale of 0–50 microamperes. |

Given these values, the emitter current $L_E$ is −50 microamperes and the maximum load current is $-\alpha I_E$ which is less than 50 microamperes (approximately 48 microamperes for a typical transistor) since $\alpha$ equals approximately .96. The slight inaccuracy due to the voltage drop between the collector and base of the transistor is negligible. For example, in the saturation region, the maximum collector-to-base voltage is 50 millivolts. Hence, if it is assumed that the entire direct-current voltage from source 70 appears across the diode 60, the percentage voltage error is $$\text{Maximum percentage voltage} = \frac{0.05}{20}(100\%) = 0.25\% \quad (12)$$

As leakage current is not a linear function of voltage, it can be safely assumed that the percentage of current error is less than 0.25%.

Figure 8:
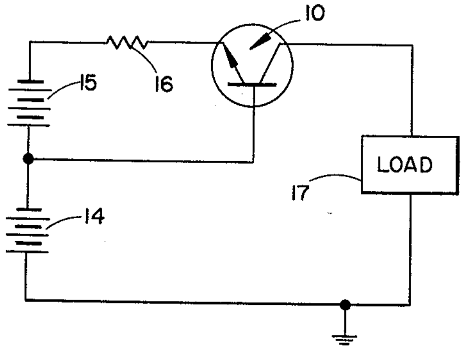
FIG. 8 illustrates the overload protection circuit as applied to a power supply.

The circuit of FIG. 3 has one possible disadvantage when used to protect a power supply from short circuits and/or high current overloads in that the load 17 may not be allowed to float with respect to ground potential. A solution to the problem is illustrated in FIG. 8 wherein the voltage supply 15 is floated with respect to ground. The remaining part of the circuitry is identical to that of FIG. 3.

Although the invention has been described and illustrated in detail, it is to be clearly understood that the same is by way of illustration and example only and is not to be taken by way of limitation, the spirit and scope of this invention being limited only by the terms of the appended claims.

I claim:

1. A protective circuit for preventing alternating currents through a load from exceeding a predetermined value, said circuit comprising: first and second transistors of opposite conductivity types, each transistor having a collector, emitter, and base electrode; first and second unilateral conducting devices coupled together and disposed between the collectors of said transistors, said first unilateral device being connected to conduct away from the collector of said first transistor, and said second unilateral device being connected to conduct toward the collector of said second transistor; a load circuit having one end connected to the junction between said unilateral devices; each of said base electrodes being connected to a common junction; an alternating current source having a first terminal connected to the other end of said load circuit, said alternating current source further having a second terminal connected to said common junction; and first and second emitter biasing circuits coupled to said first and second transistor emitters, respectively, for biasing said transistors in their respective forward bias directions.

2. The protective circuit defined in claim 1 wherein said first transistor is of the PNP type and said second transistor is of the NPN type, said first emitter biasing circuit including a battery with the positive terminal coupled to the emitter of said first transistor through a first resistor, said second emitter biasing circuit including a battery with the negative terminal coupled to the emitter of said second transistor circuit through a second resistor.

3. The protective circuit defined in claim 1 wherein said first transistor is of the PNP type and said second transistor is of the NPN type, said first unilateral device having its anode connected to the collector of said first transistor and its cathode connected to the anode of said second unilateral device, and said second unilateral device having its cathode connected to the collector of said second transistor.

References Cited in the file of this patent

UNITED STATES PATENTS

| | | |
|---|---|---|
| 2,504,628 | Benzer | Apr. 18, 1950 |
| 2,594,449 | Kircher | Apr. 29, 1952 |
| 2,595,208 | Bangert | Apr. 29, 1952 |
| 2,629,833 | Trent | Feb. 24, 1953 |
| 2,709,780 | Kircher | May 31, 1955 |
| 2,716,729 | Schockley | Aug. 30, 1955 |
| 2,801,346 | Rongen et al. | July 30, 1957 |
| 2,809,240 | Freedman | Oct. 8, 1957 |
| 2,859,402 | Schaeve | Nov. 4, 1958 |
| 2,907,932 | Patchell | Oct. 6, 1959 |
| 2,921,264 | Sundt | Jan. 12, 1960 |
| 2,938,174 | Belleyment | May 24, 1960 |

FOREIGN PATENTS

| | | |
|---|---|---|
| 751,679 | Great Britain | July 4, 1956 |
| 752,031 | Great Britain | July 4, 1956 |

OTHER REFERENCES

Shockley et al.: Physical Review, vol. 83, No. 1, page 153, July 1, 1951.

Bell: The Transistor, Bell Telephone, pages 205, 314, Dec. 4, 1951.

Shea: "Principles of Transistor Circuits," Sept. 15, 1953, pages 503–507.